(12) United States Patent
Safaee

(10) Patent No.: US 10,804,333 B2
(45) Date of Patent: Oct. 13, 2020

(54) DISPLAY, CIRCUIT ARRANGEMENT FOR A DISPLAY AND METHOD OF OPERATING A DISPLAY

(71) Applicant: OSRAM Opto Semiconductors GmbH, Regensburg (DE)

(72) Inventor: Alireza Safaee, Cupertino, CA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 36 days.

(21) Appl. No.: 16/194,246

(22) Filed: Nov. 16, 2018

(65) Prior Publication Data

US 2020/0161378 A1 May 21, 2020

(51) Int. Cl.
*H01L 27/32* (2006.01)
*H01L 27/15* (2006.01)
*G09G 3/3283* (2016.01)
*G09G 3/3216* (2016.01)

(52) U.S. Cl.
CPC ......... *H01L 27/322* (2013.01); *G09G 3/3216* (2013.01); *G09G 3/3283* (2013.01); *H01L 27/156* (2013.01); *H01L 27/3246* (2013.01)

(58) Field of Classification Search
USPC ........................................................ 345/83
See application file for complete search history.

(56) References Cited

U.S. PATENT DOCUMENTS

| | | | | |
|---|---|---|---|---|
| 4,466,017 A * | 8/1984 | Banker | ............... | G06F 11/1028 380/226 |
| 2002/0000982 A1* | 1/2002 | Takagi | ..................... | G09G 5/18 345/204 |
| 2002/0175634 A1* | 11/2002 | Ishizuka | .............. | G09G 3/3216 315/169.1 |
| 2003/0184504 A1* | 10/2003 | Abe | ..................... | G09G 3/3216 345/76 |
| 2004/0263437 A1* | 12/2004 | Hattori | ................. | G11C 27/028 345/76 |
| 2006/0001613 A1* | 1/2006 | Routley | ............... | G09G 3/3216 345/76 |
| 2006/0023012 A1* | 2/2006 | Han | ..................... | B41J 2/04543 347/12 |
| 2006/0139263 A1* | 6/2006 | Choi | .................... | G09G 3/3283 345/76 |
| 2008/0122758 A1* | 5/2008 | Kim | ..................... | G09G 3/3233 345/76 |
| 2009/0002535 A1* | 1/2009 | Park | ..................... | H04N 5/3745 348/308 |
| 2010/0102752 A1* | 4/2010 | Chen | ...................... | H05B 45/20 315/294 |

(Continued)

*Primary Examiner* — Chineyere D Wills-Burns
(74) *Attorney, Agent, or Firm* — Slater Matsil, LLP

(57) ABSTRACT

A display, a circuit arrangement for a display and a method of operating a display are disclosed. In an embodiment a display includes a plurality of pixels, each pixel of the plurality of pixels includes a given number of light emitters, a current control element for each light emitter, the current control element configured to control an electric current through the light emitter and at least one digital circuit element for each light emitter, the at least one digital circuit element configured to provide at least one data value to the current control element and the at least one data value being indicative of the current through the light emitter.

10 Claims, 4 Drawing Sheets

(56) References Cited

U.S. PATENT DOCUMENTS

2015/0371591 A1* 12/2015 Suzuki ................. G09G 3/3291
                                                                        345/208
2016/0353042 A1* 12/2016 Wang ................ H01L 27/14614
2019/0156720 A1* 5/2019 Blank .................... G11C 13/04

* cited by examiner

DISPLAY, CIRCUIT ARRANGEMENT FOR A DISPLAY AND METHOD OF OPERATING A DISPLAY

TECHNICAL FIELD

The present disclosure relates to displays, circuit arrangements for a display and methods of operating a display.

BACKGROUND

Displays, such as, for example, video walls, may comprise a plurality of pixels arranged in an array-like structure. Each pixel of the display may comprise a given number of LEDs which are very close to but still separated from each other. Each pixel may, for example, comprise three LEDs with one LED emitting red light, one LED emitting green light and one LED emitting blue light. Such a pixel is sometimes called RGB LED pixel, where RGB means red, green and blue. At a common viewing distance, the separate LEDs of a pixel are usually indistinguishable for the human eye. In dependence on the operation of the LEDs of a pixel, a desired color can be generated. All the pixels together arranged in the display surface may conform the color image.

For a display made of a plurality of pixels, the trend currently moves toward smaller pixels, more color levels and faster refresh rates of the pixels. This may result in faster operations and higher switching frequencies of the display. Parasitic capacitances, for example, in the pn-junctions of the LEDs inside each pixel or in the electric circuit of the display, may not be huge, but may add up quickly, in particular when the display comprises a large amount of LEDs and when the display operates at a high switching frequency. The parasitic capacitances may generate undesirable visual effects. Such effects may appear as unwanted light from some pixels which are supposed to be dark, and such visual effects are also known as upper and lower ghosting effects. These effects are also more prominent at faster switching operations. There is a need for an effective display that can operate at high switching speeds with low or even no ghosting effects.

SUMMARY

Embodiments provide displays, circuit arrangements and methods for operating a display.

In embodiments displays are provided. In some examples, a display comprises a plurality of pixels, each pixel of the plurality of pixels comprising: a given number of light emitters, which are, for example, arranged in parallel electric lines with a light emitter per electric line, a current control element for each light emitter, the current control element for a light emitter being configured to control an electric current flowing through the light emitter, and at least one digital circuit element for each light emitter, the at least one digital circuit element being configured to provide at least one data value to the current control element of the light emitter, the at least one data value being indicative of the current flowing through the light emitter.

In some examples, each pixel may comprise three light emitters which are LEDs (LED=light emitting diode). One LED may be adapted to emit red light, one LED may be adapted to emit green light, and one LED may be adapted to emit blue light. The pixel may therefore be a RGB LED pixel (RGB for red, green and blue) and the pixel may be able to produce any color in accordance with the RGB color model by a corresponding operation of the LEDs. There may also be more or less than three LEDs in a pixel. For example, a LED which emits yellow light may additionally be arranged in each pixel.

The current control elements may be PWM driven current control elements, for example, PWM controlled current sources (PWM for pulse width modulation or pulse width modulated). Each current control element may therefore be adapted to provide a fixed level of current through the associated light emitter and to control the light intensity of the light emitter using pulse width modulation. A current control element for a LED may include a transistor, which can control the current through the LED.

In some examples, the data value provided to the current control element of a light emitter of a pixel may specify a parameter related to the pulse width modulation applied to the current control element for the light emitter. For example, the data value may be a number or a value related to the duty ratio or duty cycle of the fixed current provided by the current control element for the light emitter.

The data value may be provided in form of a p-bit data value. For example, p may be a positive integer and may in particular be equal to 1. Thus, the data value may be provided as a 1-bit data value. The i-bit data value may be indicative whether the current to be provided by the current control element is switched on or off. The data value may be provided in form of a bit stream or in form of other data while the PWM based operation of a light emitter may take place within each pixel. Parasitic capacitances in the circuitry may therefore not cause an undesired illumination of a light emitter during such periods of time when the light emitter is supposed to be off. Thus, the use of digital data to control the operation of the current control elements of a pixel may simplify the electric circuitry of the display and may help to keep lower and upper ghosting effects low or may even eliminate such ghosting effects.

In some examples, the at least one digital circuit element for a light emitter comprises at least one of an 1-bit shift register and an 1-bit latch. L may be a positive integer, such as "1". The shift registers and latches may support the provision of the data values to the current control elements of a pixel.

In some examples, the 1-bit shift register is configured to receive the data value and to provide the data value to the 1-bit latch, and the 1-bit latch is configured to provide the data value to the current control element of the light emitter. The output of the latch, which may be either "0" or "1", may turn on or off the current control element. If turned on, the current control element may then provide a fixed current for the associated light emitter.

In some examples, the 1-bit shift registers of the light emitters of a pixel are arranged in series. This may be used to propagate data through the series of shift registers. The propagation of the data may be triggered by a clock signal.

In some examples, each pixel may be adapted to receive at least a signal. For example, each pixel may comprises at least one receiving component for receiving at least an input signal. The receiving component may include a pin through which the input signal can be provided to the pixel.

In some examples, each receiving component includes a Schmitt trigger, in particular a non-inverting Schmitt trigger. Each Schmitt trigger may provide an input for a received signal and an output for providing an output signal to a subsequent digital component, such as the at least one digital circuit element. The output signal corresponds to the input signal after it has passed the Schmitt trigger. The Schmitt trigger may ensure the noise-immunity of the output signal.

In some examples, the at least one receiving component comprises at least one of: a receiving element for receiving a clock signal, a receiving element for receiving a light emitter update signal, and a receiving element for receiving a bit stream of data, the bit stream of data comprising the at least one data value.

In some examples, a pixel comprises at least one current reference element for providing a reference current to at least one current control element of the pixel. The current reference of a pixel may be shared between all current control elements of the pixel or there may be a separate current reference for each current control element of a pixel. The current reference may be fully internal and may not need an element which is at the outside of the pixel. This may help to decrease or even avoid ghosting effects.

In some examples, a display comprises a controller, in particular a tile controller, the controller may be connected to N rows of M pixels, the M pixels of each of the N rows of pixels may be arranged in series, the controller may comprise for each of the N rows of pixels a row controller, and the row controller for a row of pixels may be adapted to receive row data, to generate a bit stream of serial data from the received row data, and to provide the bit stream of serial data to the row of pixels. N and M are positive integers, such as 1, 2, 3, and so on.

The row data may be provided by the tile controller, which may be a fully digital block or element within a top level display controller, to the row controller. The row data may be generated from a tile data signal provided to the top level display controller and may include data, for example, in form of a data stream, by which the operation of the pixels of the row of pixels may be controlled.

In some examples, a row controller comprises at least one signal generator for generating a control signal for the at least one pixel of the row associated with the row controller, the control signal being generated based on the row data received by the row controller.

In some examples, a row controller comprises at least one shift register for generating the bit stream of serial data based on the control signal provided by the at least one signal generator to the shift register.

In some examples, a row controller of a row of pixels comprises M signal generators for generating control signals for the M pixels of the row of pixels, and each signal generator being adapted to provide K control signals, wherein M and K are positive integers corresponding to the given number of light emitters in each of the M pixels of the row of pixels.

In some examples, the row controller comprises a K times M bit long shift register for generating the bit stream of serial data from the control signals provided by the M signal generators.

In some example, a signal generator may be adapted to generate at least one PWM signal for a pixel. The signal generator may in particular be adapted to generate three PWM signals per pixel. Each of the three PWM signals may serve to control the current through one of the LEDs in the pixel.

The PWM signals of the signal generators of the row of pixels may be sampled and loaded to at least one parallel-in serial-out shift register. The output of the shift register may be sent out serially to form a row of bit streams going to the pixels with a speed derived from a clock signal.

In some examples, a row controller of a row of pixels is adapted to receive at least one of the following signals: a clock signal, an update signal, and a frame start signal.

In some examples, at least one of the clock signal, the update signal, and the frame start signal is provided by the controller or a top level display controller to the row controller. The top level display controller may be connected to the controller, which may be a tile controller.

In some examples, a signal generator of a row controller comprises at least one data processing component for receiving an n-bit data signal and for generating a 1-bit data signal based on the n-bit data signal. n is a positive integer such as 1, 2, 3, and so on.

In some examples, the display may be a video wall or another type of display, such as a display of an electronic device, like a laptop, a display of a portable electronic device, such as a smartphone, or a display of a wearable electronic device, such as a smartwatch.

In further embodiments circuit arrangements for displays are provided. In some examples, a circuit arrangement for a display comprises a plurality of pixels, each pixel of the plurality of pixels comprising: a given number of light emitters, which are, for example, arranged in parallel electric lines with a light emitter per electric line, a current control element for each light emitter, the current control element for a light emitter being configured to control an electric current flowing through the light emitter, at least one digital circuit element for each light emitter, the at least one digital circuit element being adapted to provide at least one data value to the current control element of the light emitter, the at least one data value being indicative of the current flowing through the light emitter, and a controller, in particular a tile controller, the controller being connected to N rows of M pixels, the M pixels of each of the N rows of pixels being arranged in series. N and M are positive integers.

In some examples, the controller comprises a row controller for each of the N rows of pixels, the row controller for a row of pixels being adapted to receive row data, to generate a bit stream of serial data from the received row data, and to provide the bit stream of serial data to the row of pixels, the bit stream of serial data comprising the at least one data value.

In yet other embodiments methods for operating a display are provided. In some examples, each pixel of a plurality of pixels of a display comprises: a given number of light emitters, which are, for example, arranged in parallel electric lines with a light emitter per electric line, a current control element for each light emitter, the current control element for a light emitter being configured to control an electric current flowing through the light emitter, and at least one digital circuit element for each light emitter, and the method comprises: providing, by use of the at least one digital circuit element, at least one data value to a current control element of a light emitter of a pixel, and operating the current control element of the light emitter of the pixel in accordance with the provided data value.

In some examples, the method may comprise receiving row data, generating a bit stream of serial data from the received row data, and providing the bit stream of serial data to a row of pixels. The at least one data value provided to a pixel of the row of pixels may be obtained from the bit stream of serial data. Each pixel may be configured to generate or extract the at least one data value from the bit stream of serial data. The extraction or generation of the data value may take place internally and thus on the pixel level.

In accordance with some examples, a method of operating a display with a controller connected to N rows of M pixels arranged in series comprises: receiving row data for a row of pixels of the N rows of pixels, generating a bit stream of serial data from the received row data, and providing the bit stream of serial data to the row of pixels. N and M are positive integers.

In some examples, a pixel of the row of pixels receives the bit stream of serial data and generates from the bit stream of serial data at least one data value for operating a current control element of a light emitter of the pixel in accordance with the at least one data value.

In some examples, the bit stream of serial data is provided to each pixel of the row of pixels. For each row of pixels, the bit stream may propagate from each pixel to the next with a speed determined from a clock signal. The clock signal may be provided to each pixels of the row of pixels.

DETAILED DESCRIPTION OF ILLUSTRATIVE EMBODIMENTS

In the following description of examples, reference is made to the accompanying drawings in which are shown by way of illustration specific examples that can be practiced. It is to be understood that other examples can be used, and structural changes can be made without departing from the scope of the various examples.

Figure 1:
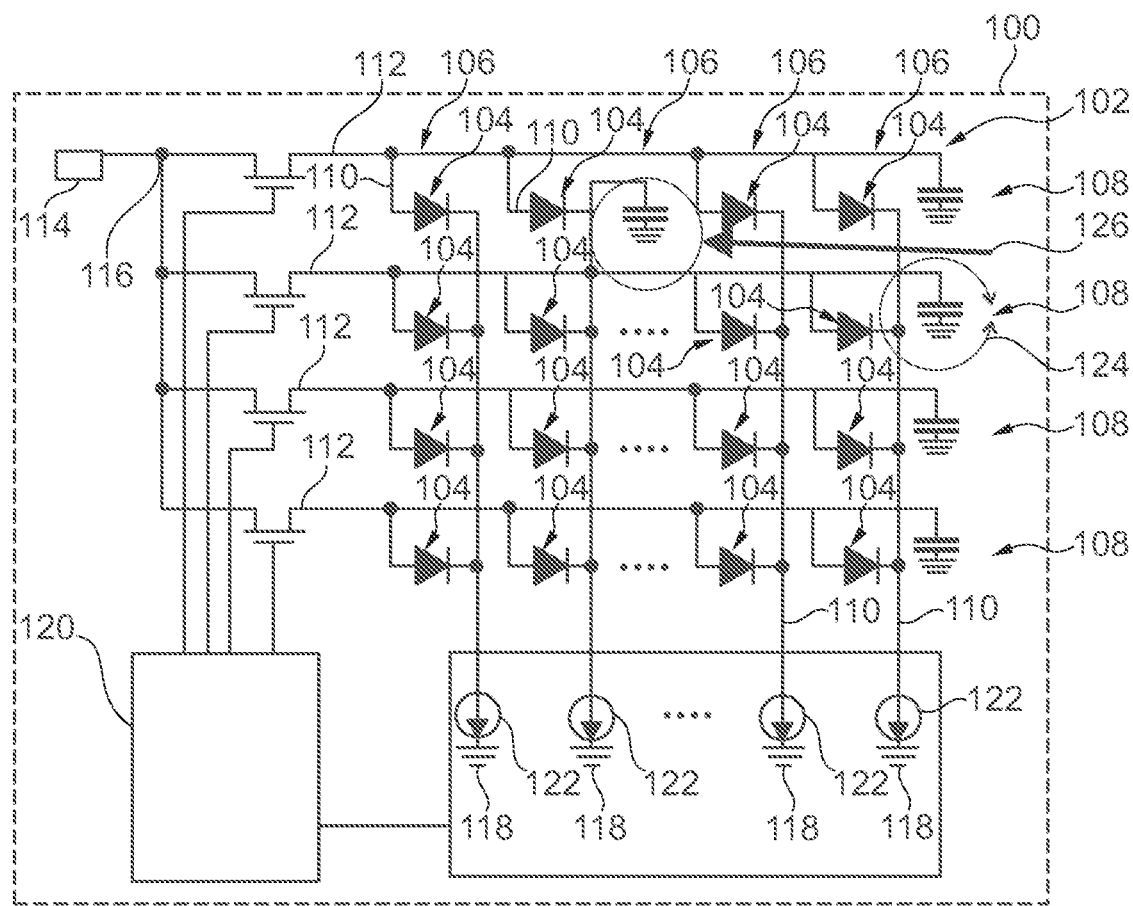
FIG. 1 is a block diagram of a display.

FIG. 1 is an illustration of a block diagram of an electronic circuit 102 of a display. The electronic circuit 102 may, for example, be arranged on a printed circuit board (PCB) and may comprise a plurality of light emitters, here LEDs 104, which are arranged in a plurality of columns 106 and rows 108. Each row 108 comprises an electric line 112 and each column 106 comprises an electric line no.

A voltage supply 114 is adapted to provide a first voltage level 116 to the electric lines 112 of the rows 108 and a second voltage level 118, corresponding to the ground level, to the electric lines no of the columns 106 as shown in FIG. 1. The second voltage 118 may in some examples also correspond to a level above the ground level, which may, for example, be in the range between 3.5 V and 0 V. A decrease to a lower level which is above zero Volt may help to ensure that non-active rows are not heavily operated in reverse bias. The display 100 comprises a microprocessor 120 which may, for example, be a digital processor or a field-programmable gate array and which is adapted to control the provision of the first voltage level 116 repeatedly and in a consecutive order to the electric lines 112 of the rows 108. In particular, a period of one refresh time, which corresponds to 1 over the refresh rate of the display 100, may be divided evenly between the rows 108 and at each moment of time only one of the rows 108 may be connected to the terminal of the voltage supply 114 which provides the first voltage level 116.

The second voltage level can relate to the non-active voltage level which may correspond to the ground level or to a voltage level above 0 V. The second voltage level can, for example, be in the range between 3.5 V and 0 V. An exemplary value for the non-active voltage level can be 3.3 V. When the present disclosure mentions the ground level or a switching to the ground level, this may also include the non-active voltage level or a switching to the non-active voltage level.

A LED 104 which is arranged in one of the rows 108, say a first row, and in one of the columns 106, say a first column, interconnects the electric line 112 of the first row and the electric line 110 of the first column. Each of the electric lines 110 of the columns 106 comprises a current source 122. A current source 122 is used to drive the LED 104 connected between its column 106 and the active row 108. A current source 122 may, for example, include a transistor to control or switch on and off the current through the associated LED 104. It would be possible to change the level of a current linearly to control the intensity of light of that LED 104. However, this method is seldom used because of normal variations between the LEDs of the same type. A more practical approach is to use a fixed level of a current in the current sources 122 and to control the light intensity of the respective LED 104 using a pulse width modulation (PWM).

Parasitic capacitors 124 in the circuit, for example, in a printed circuit board, and parasitic capacitors 126 in the pn-junctions of the LEDs 104 are difficult to avoid or even inevitable. The effective parasitic capacitance on each column 106 results in an unwanted visual effect known as lower ghosting. The dominant contributor to lower ghosting is usually a capacitance between the traces and the printed circuit board.

Also the effective capacitance of each row 108 may cause another undesirable possible effect known as upper ghosting. Such ghosting effects are undesirable and should be avoided. The present disclosure seeks to provide displays, circuit arrangements for a display, and methods of operating a circuit arrangement of a display in which such undesirable ghosting effects are reduced or even eliminated.

Figure 2:
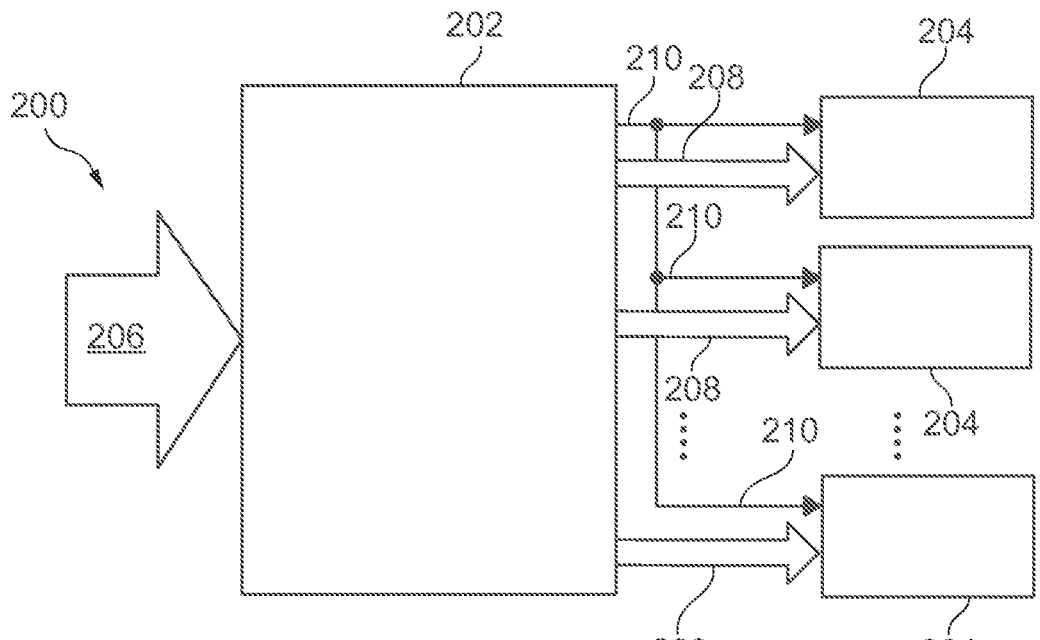
FIG. 2 is a block diagram of a controller set-up of a display.

FIG. 2 illustrates a block diagram of a controller set-up of a display 200, according to various examples. The display 200 comprises a top level display controller 202 and several tile controllers 204. Video input data 206, for example, in a HDMI-format, is provided to the top level display controller 202 which is in charge of dividing the data and sending the divided data 208 to the individual tile controllers 204. The top level display controller 202 also generates a synchronization signal 210 which ensures that all the images shown on tiles of the display are in full synchronization. Having the concept of tiles allows more flexibility in the aspect ratio of the whole display, and it is possible to mount tiles on curved areas and also having non-rectangular display shapes.

Figure 3:
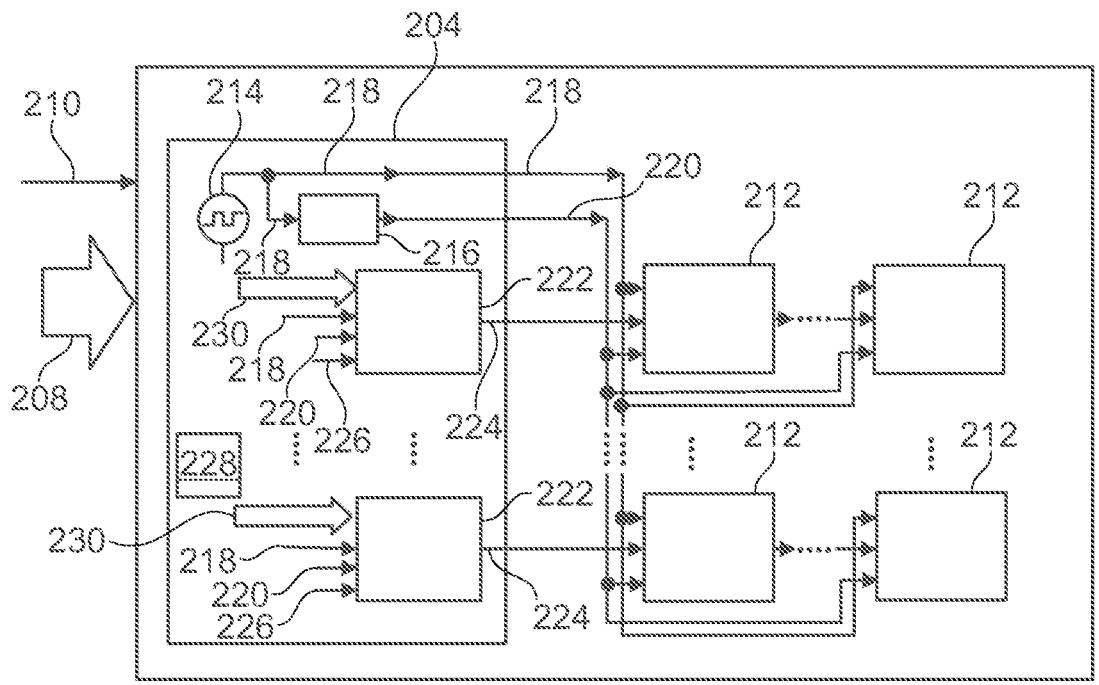
FIG. 3 is a block diagram of a part of the controller set-up of the display of FIG. 2.

FIG. 3 illustrates a block diagram of a part of the set-up of the display 200 shown in FIG. 2, according to various examples. Specifically, FIG. 3 illustrates that each tile controller 204 is connected to N rows of M pixels 212 with N and M being positive integers. Each pixel 212 is a RGB LED pixel meaning that each pixel 212 comprises three LEDs. One of the LEDs is adapted to emit red light, one of the LEDs is adapted to emit green light, and one of the LEDs is adapted to emit blue light. The RGB LED pixel 212 can therefore provide a great variety of colors by adding together the light emitted by the three LEDs of the pixel in accordance with the RGB color model. The pixels 212 are arranged in the display 200 furthermore in an array-like structure. There can also be another number of LEDs in each pixel, for example, 4 LEDs per pixel.

Each tile controller 204 can be implemented in such a way that it is fully digital. Each tile controller 204 may comprise several sub-blocks. The tile controller 204 may comprise an oscillator 214 which is adapted to generate a so-called block signal which is also named as "CLK1-signal" from the synchronization signal 210. The oscillator 214 may in particular be a precise and stable oscillator. A frequency divider 216 may divide the clock signal 218 by three times M (M corresponds to the number of pixels 212 in a row). The output of the frequency divider 216 is called "LED update" 220.

Each tile controller 204 further comprises N identical blocks, where each block comprises row controller 222. Each row controller 222 is associated with a particular row of M pixels 212 and adapted to generate a bit stream of serial data 224 to the associated row of pixels. Furthermore, each row controller 222 is adapted to receive as input signals the clock signal 218, the LED update 220 and a frame start signal 226 which, for example, is generated by the tile controller 204 based on the synchronization signal 210. Additionally, each row controller 222 receives row data.

The tile controller 204 further comprises a supervisory circuit 228 adapted to receive the tile data 208 provided to the respective tile controller 204 and to split the tile data 208 to N sets of row data 230. Each row data 230 may be associated with a particular row of the N rows of pixels. The supervisory circuit 228 may also generate the frame start signal 226 from the synchronization signal 210.

The tile controller 204 further delivers the clock signal 218 and the LED update 220 signals to all the pixels 212 and row controllers 222. Each row controller 222 provides the bit stream of serial data 224 to the M pixels 212 in the corresponding row. The data propagates from each pixel 212 to the next pixel 212 of the corresponding row with a speed determined by the clock signal 218.

Figure 4:
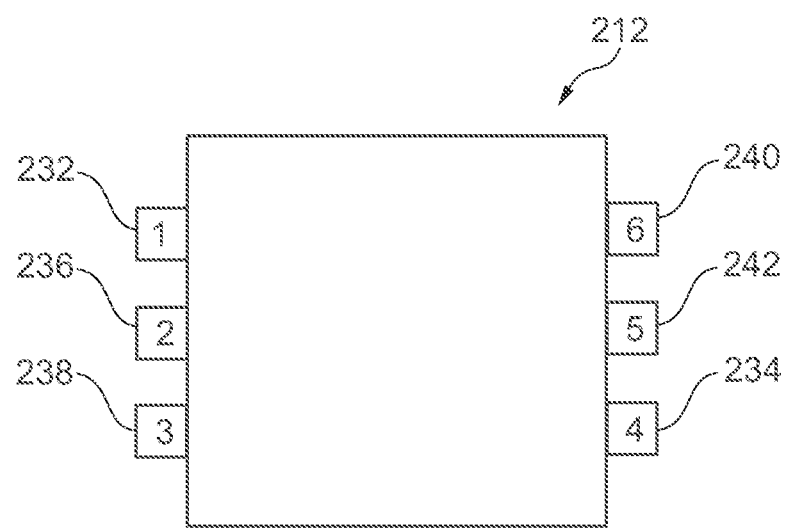
FIG. 4 is a block diagram of a pixel pinout.

FIG. 4 illustrates a block diagram of a pinout of a pixel 212. The pixel comprises two power pins, the pins with number 1 and number 4. The pin with number 1, pin 232, is adapted to receive a voltage supply, $V_{CC}$, with respect to a ground signal on pin 234, the pin with number 4.

The pixel 212 further comprises three input pins, pins with numbers 2, 3 and 6. The pin with number 2, pin 236, is intended for the input of the bit stream of serial data 224. The pin with number 3, pin 238, is intended for the input of the clock signal 218, and the pin with number 6, pin 240, is intended for the input of the LED update 220.

The pixel 212 further comprises one output pin, the pin with number 5, pin 242. The pin 242 is intended for outputting the bit stream of serial data 224 to the next pixel in the row of pixels 212.

The low number of pins per pixel 212 helps to increase the reliability and to reduce the complexity of the wire bonding inside each pixel 212.

Figure 5:
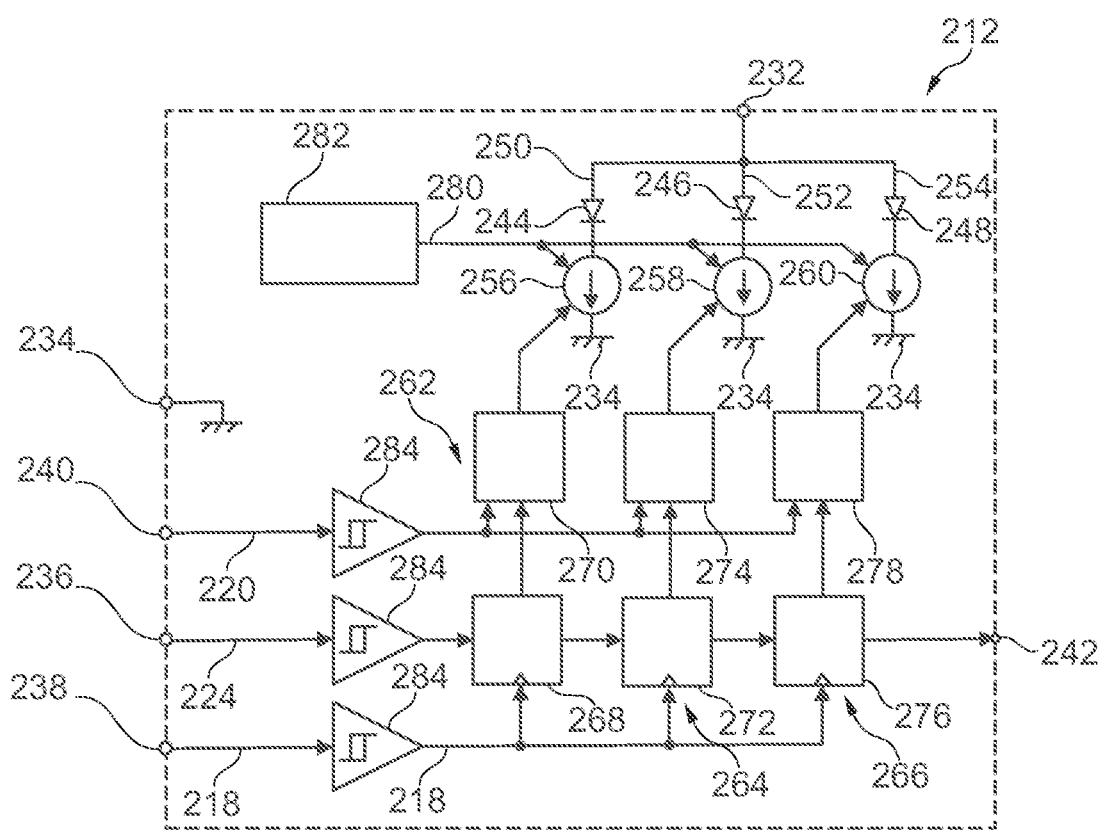
FIG. 5 is a block diagram of a pixel of a display.

FIG. 5 illustrates a block diagram of a pixel 212, according to various examples. The pixel 212 comprises three light emitters, here three LEDs 244, 246 and 248. The LED 244 may be configured to emit red light. The LED 246 may be configured to emit green light. The LED 248 may be configured to emit blue light. The pixel 212 is therefore an RGB LED pixel which can provide a great variety of colors by adding together the light emitted by the three LEDs 244, 246 and 248 in accordance with the RGB color model.

Each of the LEDs 244, 246 and 248 is arranged in an electric line 250, 252, 254, with the electric lines being arranged in parallel with respect to each other. Each electric line further comprises a current source 256, 258 and 260. Each current source is configured to control an electric current flowing through the corresponding LED of the same electric line. Furthermore, the electric voltage $V_{CC}$ is provided on pin 232 with respect to ground on pin 234 to the electric lines 250, 252 and 254.

Each current source 256, 258 and 260 is associated with a set of digital circuit elements 262, 264 and 266. Specifically, the current source 256 is associated with the set of digital circuit elements 262 which comprises a 1-bit shift register 268 and a 1-bit latch 270. The current source 258 is associated with a set of digital circuit elements 264 which comprises a 1-bit shift register 272 and a 1-bit latch 274. The current source 260 is furthermore associated with the set of digital circuit elements 266 which comprises a 1-bit shift register 276 and a 1-bit latch 278. The shift registers 268, 272 and 276 are connected in series such that an input bit stream received via pin 236 is propagated through the shift registers 268, 272 and 276 and further to output pin 242 at each cycle of the clock signal 218 received via pin 238.

When the LED update 220 arrives via pin 240 the stored values in the three shift registers 268, 272 and 276 are latched in the three 1-bit latches 270, 274 and 278. Each latch 270, 274 and 278 turns on or off the current source 256, 258 and 260 associated with the corresponding LED 240, 246 and 248.

Each current source can be an integrated current source, in form of a current mirror of the associated LED. The current source may obtain a reference point signal 280 from a current reference 282 which can be a single current reference 282 that is shared between the current sources 256, 258 and 260 as shown in FIG. 5. Alternatively, there can be three current references, wherein each current reference is dedicated to a particular current source 256, 258 and 260 (not shown). The current source 282 is fully internal and may not need an external element.

As shown in FIG. 5, each of the input signals arriving at the pins 236, 238 and 240 is passing to a fast non-inverting Schmitt trigger 284. This ensures noise-immunity of the three input signals.

Figure 6:
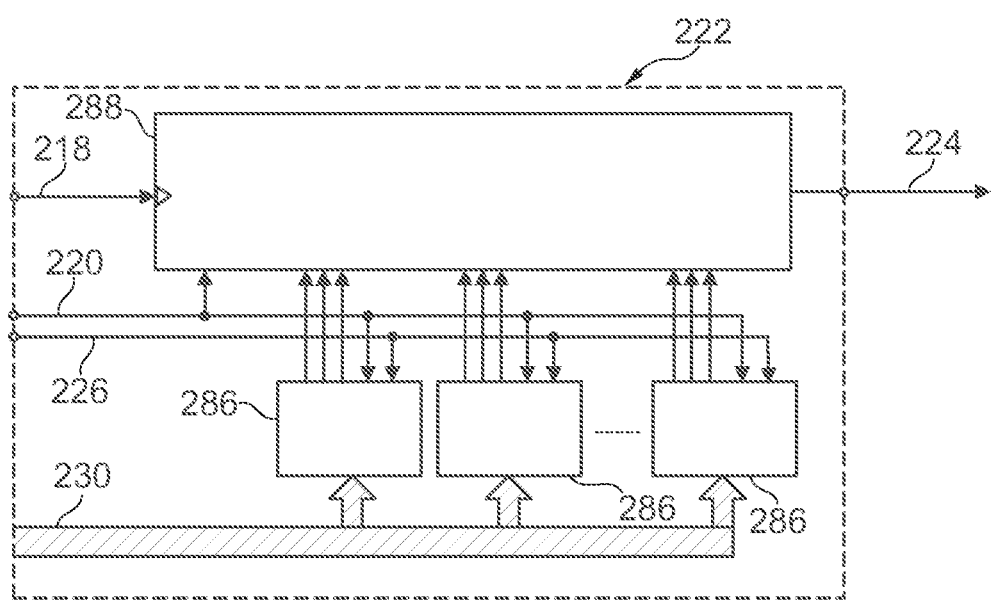
FIG. 6 is a block diagram of a row controller of a display.

FIG. 6 is a block diagram of a row controller 222 of the display 200, according to various examples. Each row controller 222 comprises M signal generators 286. Each signal generator 286 is configured to generate three PWM signals, one signal for each color (indicated by RGB) and per pixel 212 of the row of pixels.

For example, the first signal generator 286 generates three PWM signals for controlling the operation of the LEDs of the first pixel in the associated row of pixels 212. The second signal generator 286 generates three PWM signals for controlling the three LEDs of the second pixels 212 in the associated row of pixels, and so on. The PWM outputs RGB of all signal generators 286 sampled and loaded to a 3×M bit long parallel-in serial-out shift register 288. The PWM signals RGB are generated based on the row data 230 mentioned before with regard to FIG. 3.

The output of the shift register 288 corresponds to the bit stream of serial data 224 which is provided via pin 236 to the row of pixels 212 with the speed as provided by the clock signal 218.

Figure 7:
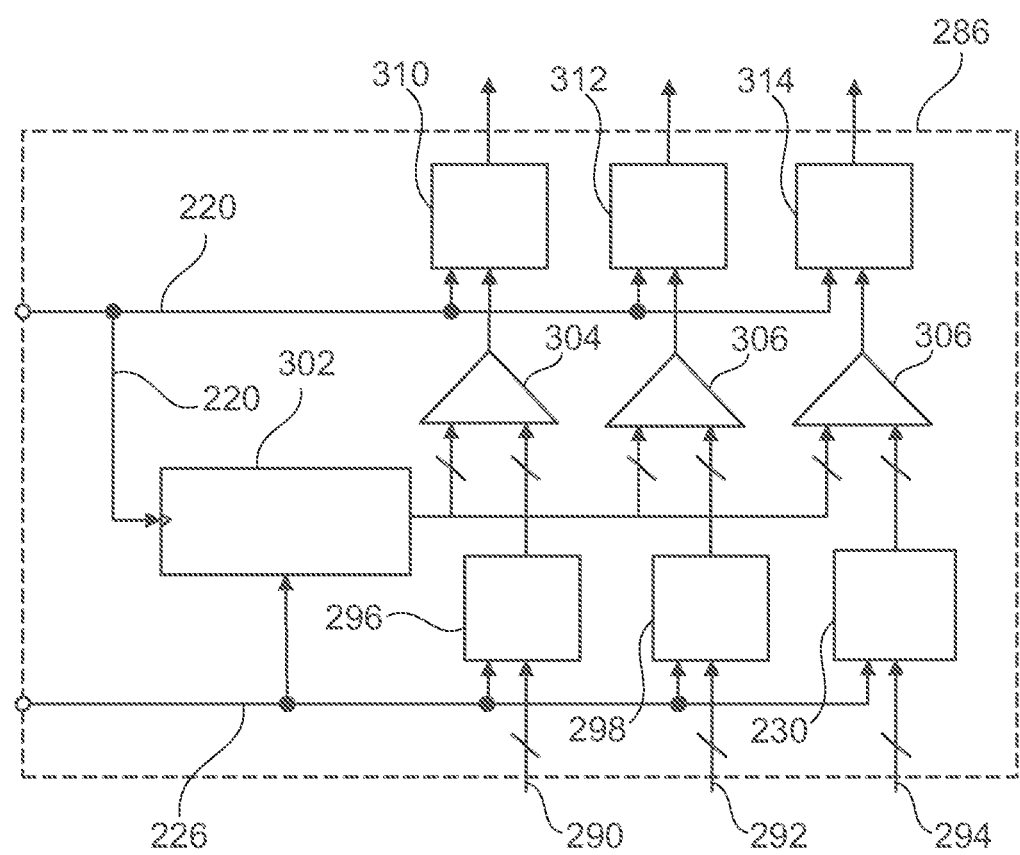
FIG. 7 is a block diagram of a signal generator of the row controller of FIG. 6.

FIG. 7 illustrates a block diagram of a signal generator 286 of the row controller 222 shown in FIG. 6, according to various examples. Each signal generator 286 receives a 3n bit data stream from the row data 230. In this data stream, there is n bit data 290, 292 and 294 for each color in each pixel 212. Each n bit data 290-294 therefore represents, for example, a duty ratio for the PWM operation of a particular LED and thus of a particular color of a pixel. For example, the n bit data 290 may be related to the LED for the color "red", the n bit data 292 may be related to the LED for the color "green" and the n bit data 294 may be related to the LED for the color "blue" of a particular pixel 212. Each n bit data is latched in an associated n bit latch 296, 298 and 300 when the frame start signal 226 arrives. At the same time n-bit counter 302 gets reset and starts counting up with the LED update 220 as clock input. The latched data for each color is compared by use of comparators 304, 306 and 308 with a counter number provided by the counter 302 to generate a PWM-signal. The PWM-signal is sampled in a respective 1-bit latch 310, 312, 314 and provided to the shift register 288 shown in FIG. 6 of the row controller 222. Thus, the duty ratio of the colors of each pixel 212 of a row can be provided in form of the bit stream of serial data 224 to the corresponding row of pixels 212. Based on this signal, the operation of the LEDs 244, 246 and 248 within each pixel 212 can be controlled.

As can be seen from the example given above, only a low number of circuitry is required to provide each pixel with signals (see the six pins shown in FIG. 4). The circuitry outside the pixel can be fully digital. This may help to reduce or minimize any ghosting effect.

The described examples can be realized in a fully integrable solution. No additional passive components may be required. This may reduce the size, component amount and thickness of a particular display. Furthermore, the described set-up may help to ensure a long operation time for each LED in the pixels 212, in particular when compared with a time-multiplexed passive matrix solution as, for example, described with regard to FIG. 1. Therefore, as the perceived light by human eye corresponds to the integration of light over time, longer operation time for LED means lower luminous flux for the LED. This may result in smaller LED dies for the same light which in turn reduces the LED die cost of the pixel. Having smaller LED die areas further means a proportionally lower current requirement, for example, to have the current density constant at an optimum value. This may allow smaller sizes of the LED driver circuitry and also lower losses. In the circuitry of the examples given above, only few low-voltage drops or resistive components may occur in the current path. This may help to reduce conduction losses and to maximize energy efficiency.

Furthermore, lower heat generation may be obtained which may reduce adverse effects of different color shifts of the different RGB LEDs. Having no time-multiplexing further means that a refresh rate and a frame rate could be the same. The refresh rate of the system may be increased without dealing with limitations of the time-shared drivers, in particular in contrast to the time-multiplexed passive matrix solution as described with regard to FIG. 1.

The described examples allow a much simpler and faster printed circuit board design and troubleshooting processes. There may be only two power planes and two signal planes shared between all pixels. There may be no trace passing an LED current from the LED driver to the pixel through the printed circuit board as the LED driving current is generated locally inside each pixel. This simplifies the process of design, increases the flexibility and may even reduce the time to market. Furthermore, a dedicated driver circuit per LED may simplify the task of color calibration per LED, since the driver is not shared and all the tolerance in the driver and the LED can be corrected with fewer correction coefficients. Each pixel may be transparent to the media control software and hardware of the display. Moreover, each pixel may further be robust against tolerances due to dedicated drivers inside each pixel for the LEDs. There may also be no visual effects, such as unwanted ghosting effects, in a row or column of a tile in case of failure in one LED or pixel. Each pixel may further be robust against wide variations of parasitic capacitance values due to an independence on the printed circuit board routing or LED junction tolerances. Moreover, a low electromagnetic interference generation and low susceptibility against other sources of electromagnetic interference can be obtained, in particular since the driving circuitry for each LED is in the associated pixel. Moreover, each pixel may be fully functional for dim or bright LEDs. Thus, there may be no impact on the level of the light levels of the LEDs. Moreover, each pixel may not show a direct temperature dependence. The tile controllers may be usable with regard to any aspect ratio of the whole display.

What is claimed is:

1. A display comprising:
   a controller connected to N rows of M pixels, the M pixels of each of the N rows arranged in series,
   wherein N and M are positive integers,
   wherein the controller comprising a row controller for each of the N rows, and
   wherein the row controller for a row of pixels is adapted to receive row data, to generate a bit stream of serial data from the received row data, and to provide the bit stream of serial data to the row of pixels.

2. The display of claim 1, wherein the row controller comprises at least one signal generator for generating a control signal for at least one pixel of the row of pixels associated with the row controller, and wherein the control signal is generated based on the row data received by the row controller.

3. The display of claim 2, wherein a signal generator of the row controller comprises at least one data processing component for receiving an n-bit data signal and for generating a 1-bit data signal based on the n-bit data signal.

4. The display of claim 2, wherein the row controller comprises at least one shift register for generating the bit stream of serial data based on the control signal provided by the at least one signal generator to the shift register.

5. The display of claim 1, wherein the row controller comprises M signal generators for generating control signals for the M pixels of the row of pixels, wherein each signal generator is adapted to provide K control signals, wherein M of the M signal generators and K are positive integers, and wherein K corresponds to a given number of light emitters in each of the M pixels of the row of pixels.

6. The display of claim 5, wherein the row controller comprises a K times M-bit long shift register, with K and M being positive integers, for generating the bit stream of serial data from the control signals provided by the M signal generators.

7. The display of claim 1,
   wherein a row controller is adapted to receive at least one of a clock signal, an update signal, or a frame start signal, and
   wherein the at least one of the clock signal, the update signal or the frame start signal is provided by the controller or a top level display controller to the row controller, the top level display controller being connected to the controller.

8. A method of operating a display, wherein the display comprises a controller which is connected to N rows of M pixels, the M pixels of each of the N rows of pixels being arranged in series, and wherein N and M are positive integer, the method comprising:
   receiving row data for a row of pixels of the N rows;
   generating a bit stream of serial data from the received row data; and
   providing the bit stream of serial data to the row of pixels.

9. The method of claim 8, wherein a pixel of the row of pixels receives the bit stream of serial data and generates from the bit stream of serial data at least one data value for operating a current control element of a light emitter of the pixel in accordance with the at least one data value.

10. The method of claim 8, wherein the bit stream of serial data is provided to each pixel of the row of pixels.

\* \* \* \* \*